US012720697B2

(12) United States Patent
Moon et al.

(10) Patent No.: US 12,720,697 B2
(45) Date of Patent: Aug. 25, 2026

(54) HOUSING ASSEMBLY HAVING WATERPROOF FUNCTION AND ELECTRONIC DEVICE INCLUDING SAME

(71) Applicant: SAMSUNG ELECTRONICS CO., LTD., Suwon-si (KR)

(72) Inventors: Heecheul Moon, Suwon-si (KR); Yongseok Lee, Suwon-si (KR); Gyeongtae Kim, Suwon-si (KR); Sangmin Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 93 days.

(21) Appl. No.: 18/617,729

(22) Filed: Mar. 27, 2024

(65) Prior Publication Data

US 2024/0237248 A1 Jul. 11, 2024

Related U.S. Application Data

(63) Continuation of application No. PCT/KR2022/014571, filed on Sep. 28, 2022.

(30) Foreign Application Priority Data

Oct. 8, 2021 (KR) ........................ 10-2021-0134210

(51) Int. Cl.
*H05K 5/00* (2025.01)
*H05K 5/03* (2006.01)
*H05K 5/06* (2006.01)

(52) U.S. Cl.
CPC ................. *H05K 5/06* (2013.01); *H05K 5/03* (2013.01)

(58) Field of Classification Search
None
See application file for complete search history.

(56) References Cited

U.S. PATENT DOCUMENTS 8,988,875 B2 * 3/2015 Gu ........................... H05K 5/02 361/679.55
9,462,165 B2 10/2016 Moon et al.
9,992,891 B2 * 6/2018 Pakula ................. H05K 5/0017
10,257,333 B2 4/2019 Kim et al.
11,399,085 B2 7/2022 Jung et al.
(Continued)

FOREIGN PATENT DOCUMENTS

EP 4024833 A1 7/2022
KR 20110041390 A 4/2011
(Continued)

OTHER PUBLICATIONS

European Search Report for European Patent Application No. 22878810.5 dated Nov. 12, 2024.
(Continued)

*Primary Examiner* — Xanthia C Relford
(74) *Attorney, Agent, or Firm* — CANTOR COLBURN LLP

(57) ABSTRACT

An electronic device includes a housing which forms an outer appearance of the electronic device and includes a frame including a step and a cover member which faces the step of the frame, a support member between the step and the cover member and is bonded to the frame and the cover member, and adhesive members which bond the support member to the housing. The adhesive members include a first adhesive member which includes a cushion layer and bonds the support member to the frame, at the step, and a second adhesive member which bonds the support member and the cover member to each other.

20 Claims, 17 Drawing Sheets

(56) References Cited

U.S. PATENT DOCUMENTS

| | | | | |
|---|---|---|---|---|
| 12,149,274 | B2 * | 11/2024 | Moon | H04M 1/0264 |
| 2012/0118628 | A1 * | 5/2012 | Pakula | H02G 11/02 156/242 |
| 2014/0253799 | A1 | 9/2014 | Moon et al. | |
| 2020/0137911 | A1 * | 4/2020 | Kim | H05K 1/189 |
| 2020/0186183 | A1 * | 6/2020 | Park | H04M 1/18 |
| 2021/0092268 | A1 | 3/2021 | Lin | |
| 2021/0136187 | A1 | 5/2021 | Jeon | |
| 2021/0168225 | A1 | 6/2021 | Bates et al. | |
| 2021/0234948 | A1 | 7/2021 | Li et al. | |
| 2021/0243907 | A1 | 8/2021 | Jung et al. | |
| 2022/0053076 | A1 * | 2/2022 | Nguyen Van | H04M 1/0264 |

FOREIGN PATENT DOCUMENTS

| | | | |
|---|---|---|---|
| KR | 20150026419 | A | 3/2015 |
| KR | 20150120137 | A | 10/2015 |
| KR | 20180096178 | A | 8/2018 |
| KR | 20200069091 | A | 6/2020 |
| KR | 20210015268 | A | 2/2021 |
| KR | 20210097335 | A | 8/2021 |
| KR | 20210101462 | A | 8/2021 |
| WO | 2020116832 | A1 | 6/2020 |
| WO | 2021066227 | A1 | 4/2021 |

OTHER PUBLICATIONS

"Galaxy S21 looks even more appealing if you know its price and specification", retrieved from https://blog.naver.com/neces2/222328664804 Mar. 25, 2024.

Korean Office Action for Korean Patent Application No. 10-2021-0134210 dated Jul. 20, 2025.

Indian Office Action for Indian Patent Application No. 202427028106 dated Jan. 12, 2026.

* cited by examiner

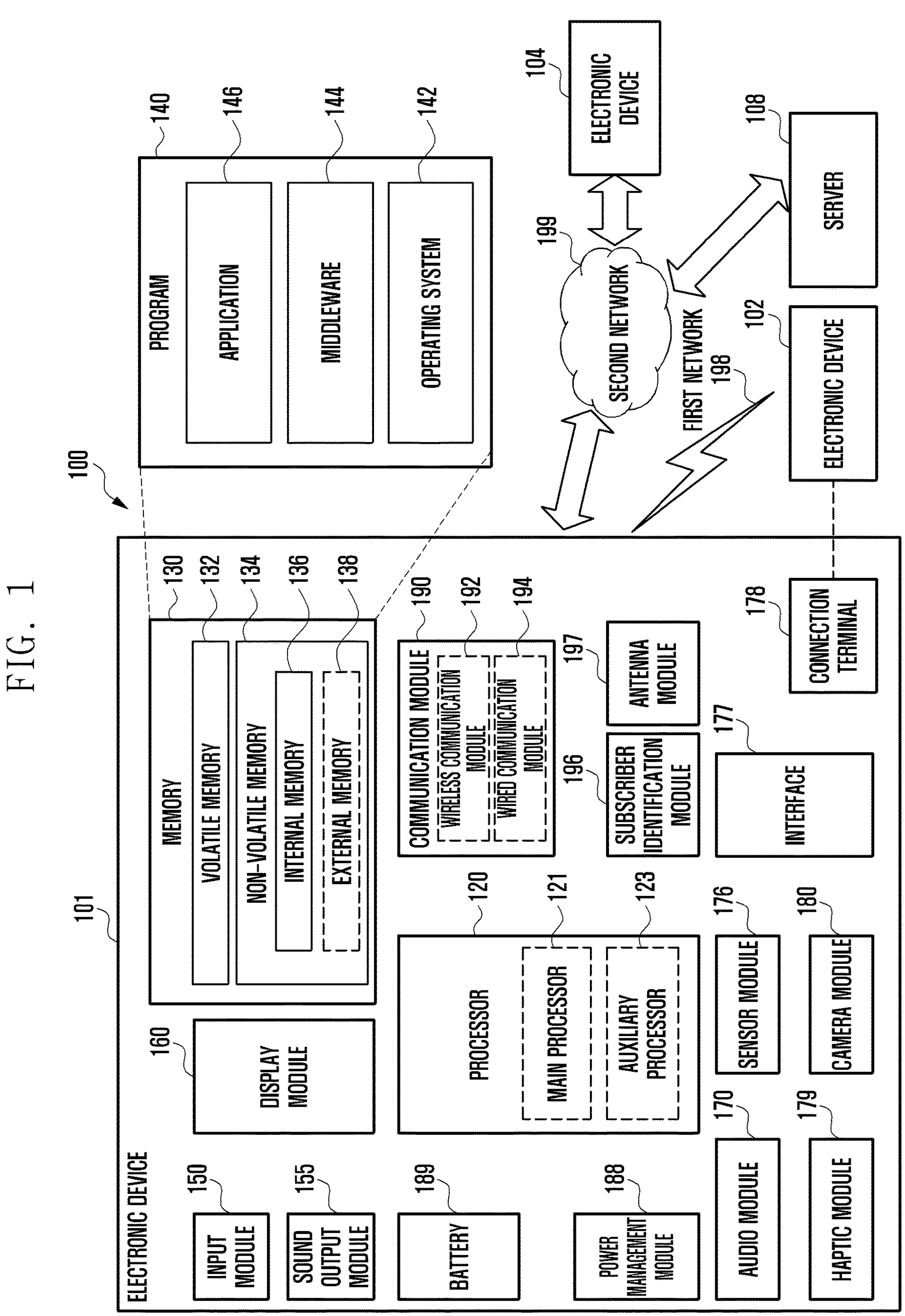
FIG. 1
100
101
ELECTRONIC DEVICE
INPUT MODULE
150
SOUND OUTPUT MODULE
155
BATTERY
189
POWER MANAGEMENT MODULE
188
AUDIO MODULE
170
HAPTIC MODULE
179
DISPLAY MODULE
160
PROCESSOR
120
MAIN PROCESSOR
121
AUXILIARY PROCESSOR
123
SENSOR MODULE
176
CAMERA MODULE
180
MEMORY
130
VOLATILE MEMORY
132
NON-VOLATILE MEMORY
134
INTERNAL MEMORY
136
EXTERNAL MEMORY
138
COMMUNICATION MODULE
190
WIRELESS COMMUNICATION MODULE
192
WIRED COMMUNICATION MODULE
194
SUBSCRIBER IDENTIFICATION MODULE
196
ANTENNA MODULE
197
INTERFACE
177
CONNECTION TERMINAL
178
PROGRAM
140
APPLICATION
146
MIDDLEWARE
144
OPERATING SYSTEM
142
SECOND NETWORK
199
FIRST NETWORK
198
ELECTRONIC DEVICE
104
SERVER
108
ELECTRONIC DEVICE
102

FIG. 6C
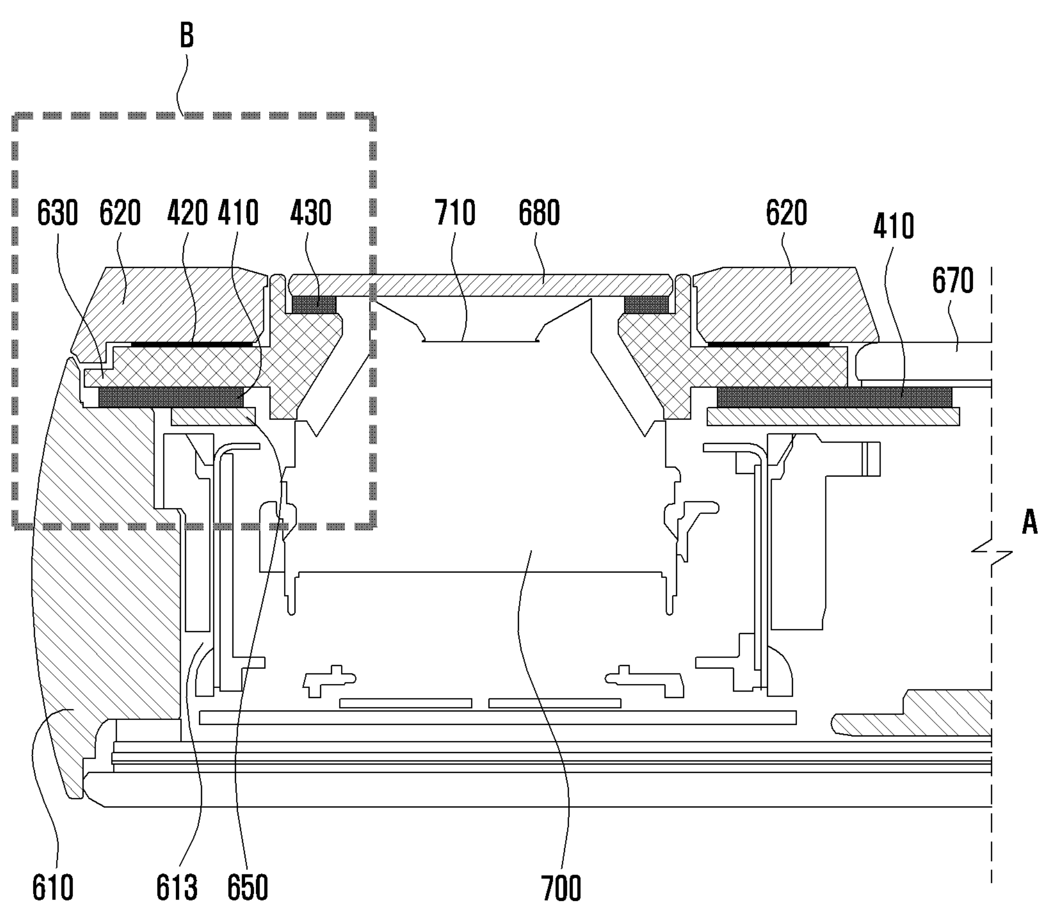
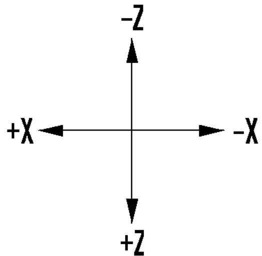

HOUSING ASSEMBLY HAVING WATERPROOF FUNCTION AND ELECTRONIC DEVICE INCLUDING SAME

CROSS-REFERENCE TO RELATED APPLICATIONS

This application is a continuation application of International Application No. PCT/KR2022/014571 designating the United States, filed on Sep. 28, 2022, in the Korean Intellectual Property Receiving Office and claiming priority to Korean Patent Application No. 10-2021-0134210, filed on Oct. 8, 2021, in the Korean Intellectual Property Office, the disclosures of which are incorporated by reference herein in their entireties.

BACKGROUND

(1) Field

Various embodiments of the disclosure relate to a housing assembly including a waterproof function and an electronic device including the same.

(2) Description of the Related Art

A housing assembly which supports various constituent elements included in an electronic device and forms an external appearance of the electronic device may include a plurality of pieces. The plurality of pieces included in the housing assembly may be mutually fixed to each other in various bonding methods, such as, for example, hooking, taping, bonding, welding, and insert bonding.

SUMMARY

With increasing use in various environments, electronic devices may be waterproofed by various components of the electronic devices. For example, a housing assembly of an electronic device may provide a waterproof function of the electronic device. Where the housing assembly includes a plurality of components bonded to each other, a bonding method between the components may provide the waterproof function.

For example, constitutions of the housing assembly may be mutually combined with each other by using an adhesive member which can achieve the waterproof function. Since the adhesive member having the waterproof function blocks moisture or foreign substances flowing in from outside, a waterproof space may be formed inside the electronic device.

Such an adhesive member may include a cushion layer formed of or including an elastic material to implement the waterproof function. In order to adhere and fix the constitutions with the adhesive member including the cushion layer, a process of compressing the adhesive member may be needed. In such a compressing process, a separation space for compressing two constitutions therein is needed, and such a separation space may form a gap in an outer appearance of the electronic device.

Various embodiments disclosed in this document may provide a housing assembly and an electronic device including the same, which can reduce a separation in the outer appearance of the electronic device even though an adhesive member including a waterproof function is used.

An electronic device according to various embodiments disclosed in this document may include a frame configured to form at least a part of an appearance of the electronic device, a seating part concavely formed in a first direction at a location spaced apart from an outer surface of the frame, a first adhesive member bonded onto the seating part and including a cushion layer, a support member accommodated on the seating part in the first direction and bonded to the first adhesive member, a second adhesive member bonded to the support member, and a cover member configured to form the appearance of the electronic device and disposed on the second adhesive member in a second direction opposite to the first direction, so that a location with respect to the support member is fixed by the second adhesive member.

A housing assembly according to various embodiments disclosed in this document may include a frame, a seating part concavely formed in a first direction at a location spaced apart from an outer surface of the frame, a first adhesive member bonded onto the seating part and including a cushion layer, a support member accommodated on the seating part in the first direction and bonded to the first adhesive member, a second adhesive member bonded to the support member, and a cover member disposed on the second adhesive member in a second direction opposite to the first direction, so that a location with respect to the support member is fixed by the second adhesive member.

According to various embodiments disclosed in this document, since the appearance gap of the electronic device including the waterproof function is reduced, the aesthetic sense of the electronic device can be improved. Further, since various problems occurring due to the gap are reduced, durability of the electronic device can be improved.

BRIEF DESCRIPTION OF THE DRAWINGS

The above and other advantages and features of this disclosure will become more apparent by describing in further detail embodiments thereof with reference to the accompanying drawings, in which:

FIG. 1 is a block diagram of an electronic device in a network environment according to various embodiments.

FIG. 6C is a cross-sectional view of an electronic device illustrated in FIG. 6A cut along line A-A.

DETAILED DESCRIPTION

Figure 2A:
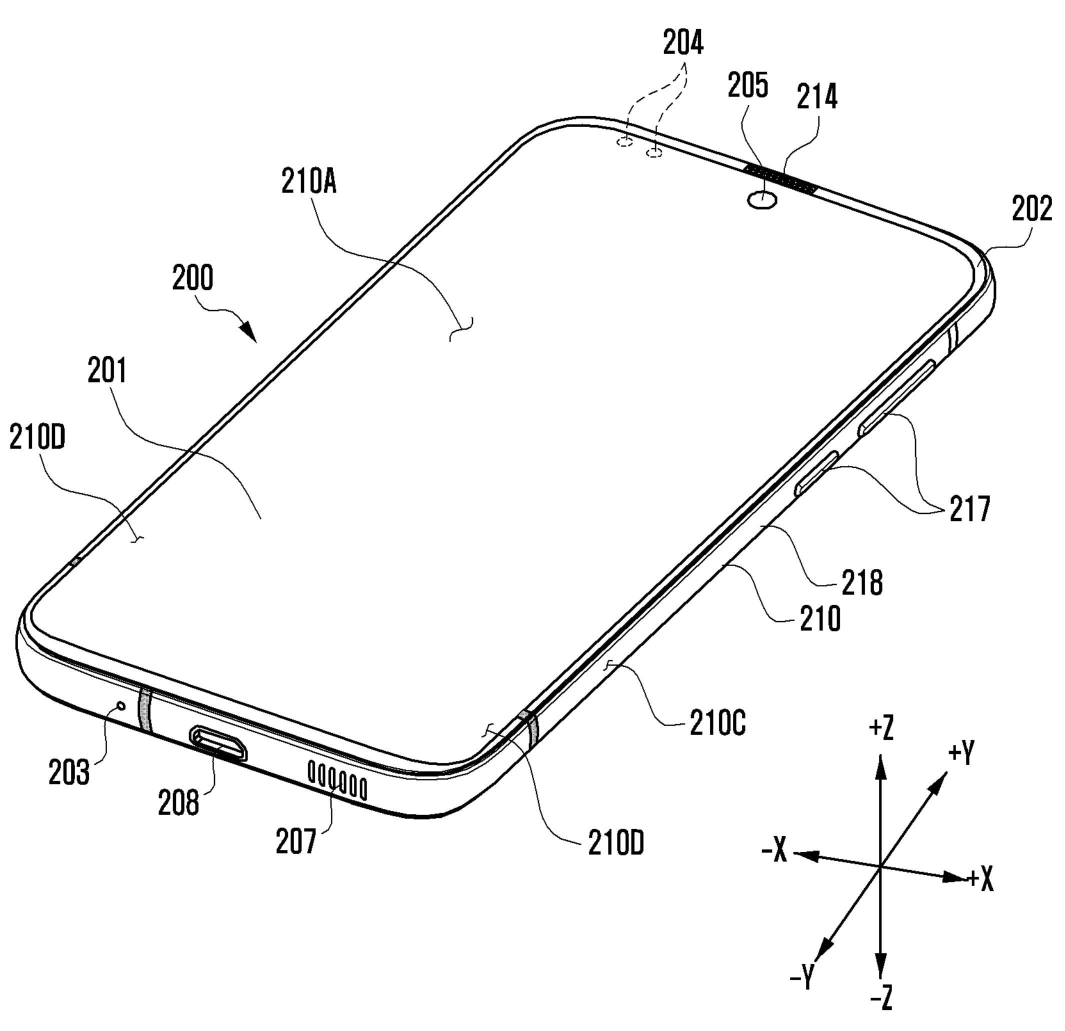
FIG. 2A is a perspective view of a front surface of an electronic device according to various embodiments disclosed in this document.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2B:
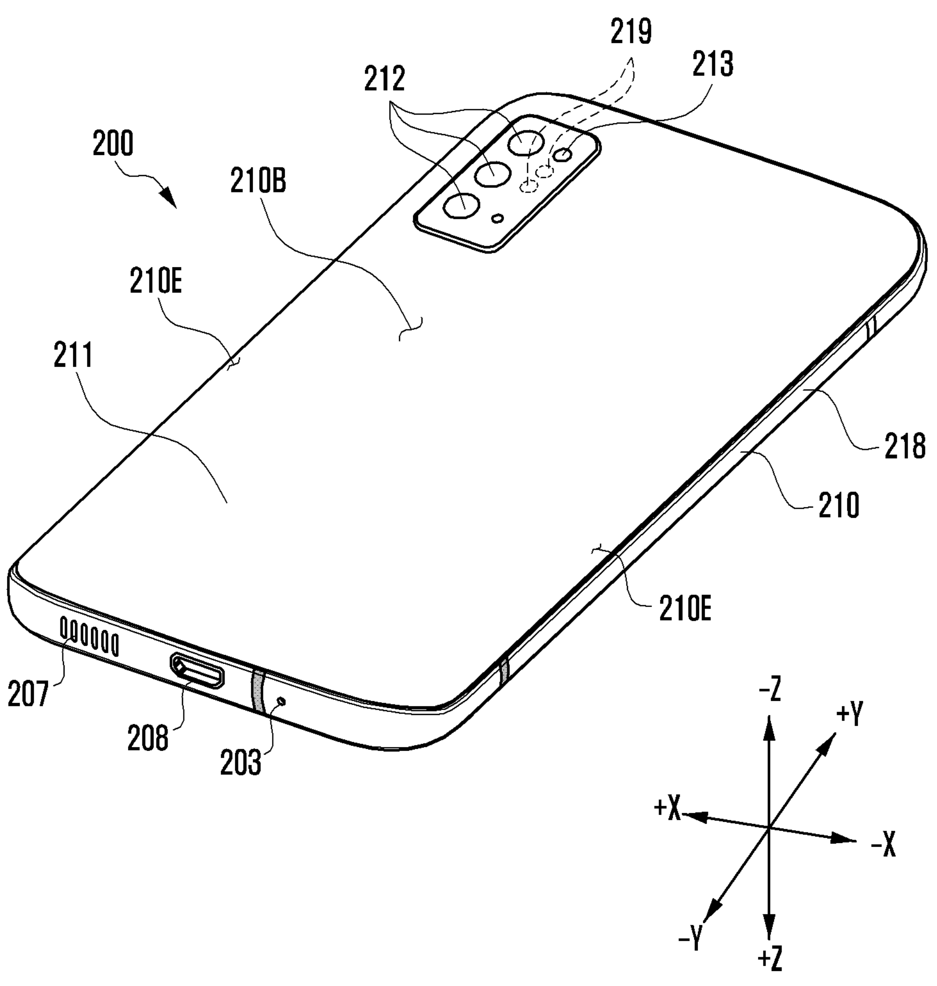
FIG. 2B is a perspective view of a rear surface of an electronic device of FIG. 2A according to various embodiments disclosed in this document.

FIG. 2A is a front perspective view of the electronic device 200 according to various embodiments disclosed in this document. FIG. 2B is a rear perspective view of the electronic device 200 of FIG. 2A according to various embodiments disclosed in this document.

The electronic device 200 in FIGS. 2A and 2B may be at least partially similar to the electronic device 101 in FIG. 1 or may further include other embodiments.

Referring to FIGS. 2A and 2B, the electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The electronic device 200 may include at least one of a display 201, sound output hole 207 and 214, sensor modules 204 and 219, camera modules 212 and 213, a key input device 217, a indicator, and connector 208. The electronic device 200 may omit at least one (e.g., the key input device 217 or the indicator) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

An input device 103 may include a microphone. In certain embodiments, the input device 203 may include a plurality of microphones disposed to detect the direction of a sound. According to an embodiment, the sound output hole 207 and 214 may be connected to speakers. In certain embodiments, the microphone, speakers, and connector 208 are disposed in the space of the electronic device 200 and may be exposed to the external environment through at least one sound output hole 207 and 214 formed in the housing 210. In certain embodiments, the sound output hole 207 and 214 formed in the housing 210 may be commonly used for microphones and speakers. In some embodiments, the sound output device may include a speaker (eg, piezo speaker) that operates without the hole formed in the housing 210.

The sensor modules 204 and 219 may generate electrical signals or data corresponding to an internal operating state of the electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor 204.

The camera modules 212 and 213 may include a first camera device disposed on the first surface 210A of the electronic device 200, and a second camera device 212 and/or a flash 213 disposed on the second surface 210B. The camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 200.

The key input device 217 may be disposed on the lateral surface 210C of the housing 210. The electronic device 200 may not include some or all of the key input device 217 described above, and the key input device 217 which is not included may be implemented in another form such as a soft key on the display 201. In another embodiment, the key input device 217 may be implemented using a pressure sensor included in the display 201.

The indicator may be disposed on the first surface 210A of the housing 210. For example, the indicator may provide status information of the electronic device 200 in an optical form. The indicator may provide a light source associated with the operation of the camera module 205. The indicator may include, for example, a light emitting diode (LED), an IR LED, or a xenon lamp.

The connector holes 208 may include a first connector hole 208 adapted for a connector (e.g., a USB connector) for transmitting and receiving power and/or data to and from an external electronic device, and/or a second connector hole adapted for a connector (e.g., an earphone jack) for transmitting and receiving an audio signal to and from an external electronic device.

Some camera modules of camera modules 212, some sensor modules 204 of sensor modules 204 and 219, or an indicator may be arranged to be exposed through a display 201. For example, the camera module, the sensor module 204, or the indicator may be arranged in the internal space of an electronic device 200 so as to be brought into contact with an external environment through an opening or transmission area of the display 201, which is perforated up to a front plate 202. According to an embodiment, the camera hole 205 where the display 201 and the camera module face each other may be formed as a transmission area with a certain transmittance as part of the area displaying content. For example, the transmission area may be formed to have transmittance having a range of about 5% to about 20%. The transmission area may include an area overlapped with a valid area (e.g., a field of view (FOV)) of the camera module 205 through which light imaged by an image sensor and for generating an image passes. For example, a transmission area of the display 201 may include an area in which the density of pixels and/or a wiring density are lower than that of surroundings. The camera module 205 may include, for example, under display camera (UDC). In another embodiment, some sensor modules 204 may be arranged to perform their functions without being visually exposed through the front plate 202 in the internal space of the electronic device. For example, in this case, an area of the display 201 facing the sensor module may not require a perforated opening.

Figure 3:
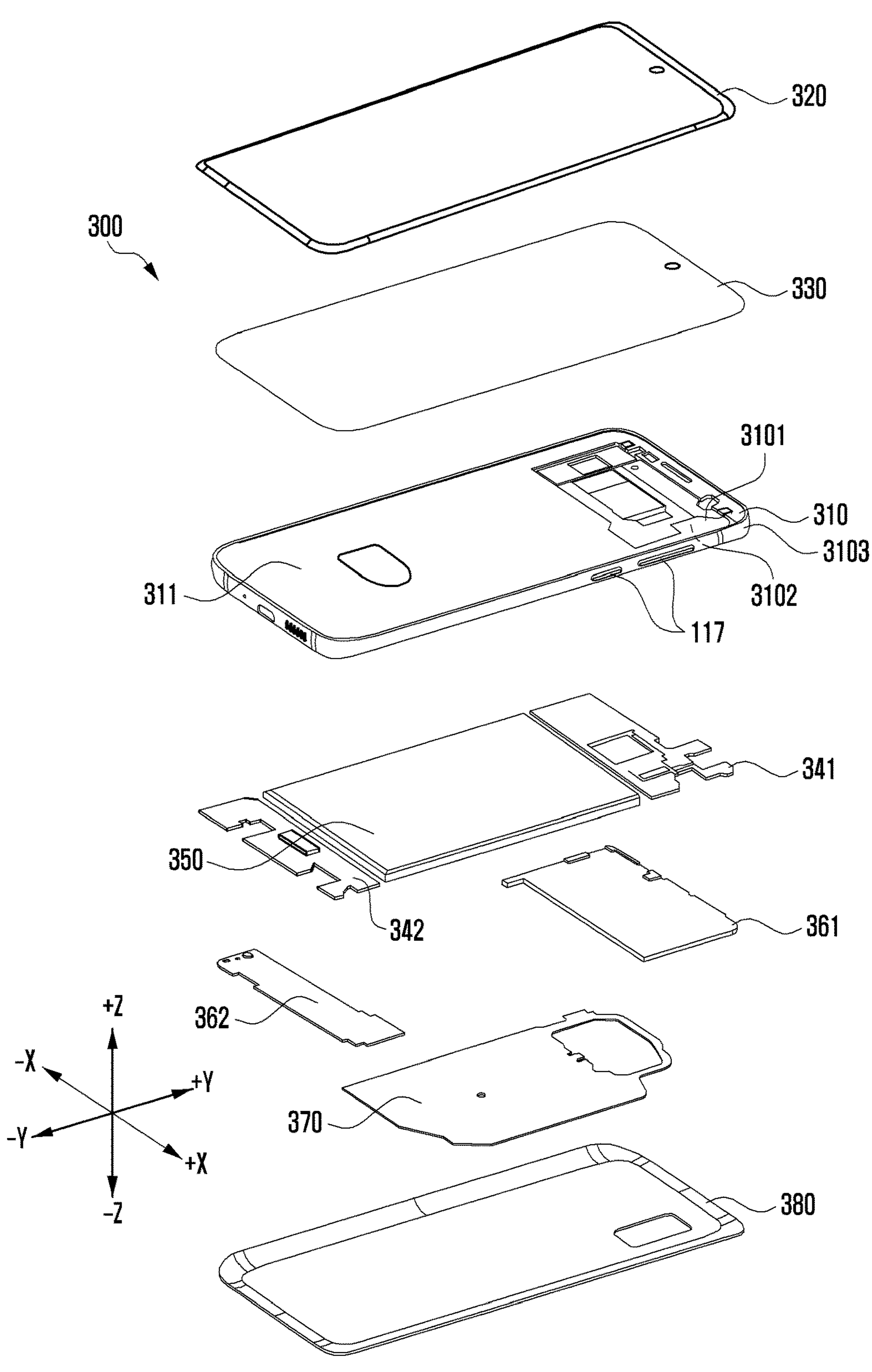
FIG. 3 is an exploded perspective view of an electronic device according to various embodiments disclosed in this document.

FIG. 3 is an exploded perspective view of an electronic device according to various embodiments disclosed in this document.

The electronic device 300 in FIG. 3 may be at least partially similar to the electronic device 101 in FIG. 1 and the electronic device 200 in FIG. 2*a* and FIG. 2*b* or may further include other embodiments.

Referring to FIG. 3, a electronic device 300 (e.g., electronic device 101 in FIG. 1) may include a lateral member 310 (e.g., lateral bezel structure 218) , a support member 311 (e.g., a bracket or support structure), a front cover 320 (e.g., front plate 202 in FIG. 2*a*), a display 330 (e.g., display 201 in FIG. 2*a*), at least one substrate 341 and 342 (e.g., printed circuit board (PCB) or flexible printed circuit board (FPCB)), a battery 350, at least one additional support 361 and 362 (e.g., rear case), an antenna 370, and a rear plate 380 (e.g., rear plate 211). The electronic device 300 may omit at least one (e.g., the support member 311 or the at least one additional support 361 and 362) of the above components or may further include another component. Some components of the electronic device 300 may be the same as or similar to those of the electronic device 101 shown in FIG. 1 or FIG. 2*a*, and thus, descriptions thereof are omitted below.

According to various embodiments, the lateral member 310 may include a first side 3101 directed in a first direction (e.g., z-axis direction), a second side 3102 directed in an opposite direction to the first side 3101, and a lateral side 3102 surrounding a space (e.g., inner space 4001 of FIG. 4) between the first side 3101 and the second side 3102. According to an embodiment, at least a part of the lateral side 3103 may form an appearance of the electronic device. According to an embodiment, the support member 311 may be disposed to extend from the lateral member 310 toward an inner space (e.g., inner space 4001 of FIG. 4) of the electronic device 300. In a certain embodiment, the support member 311 may be disposed separately from the lateral member 310. According to an embodiment, the lateral number 310 and/or the support member 311 may be formed of, for example, a metal material and/or a non-metal element (e.g., polymer). According to an embodiment, the support member 311 may be disposed to support at least a part of the display 330 through the first side 3101 and to support the at least one substrate 341 and 342 and/or at least a part of the battery 350 through the second side 3102. According to an embodiment, the at least one substrate 341 and 342 may include the first substrate 341 (e.g., main substrate) disposed on one side and the second substrate 342 (e.g., sub-substrate) disposed on the other side based on the battery 350 in the inner space of the electronic device. According to an embodiment, the first substrate 341 and/or the second substrate 342 may include a processor, a memory, and/or an interface. According to an embodiment, the processor may include, for example, one or more of a central processing unit, an application processor, a graphic processor, an image signal processor, a sensor hub processor, or a communication processor. According to an embodiment, the memory may include, for example, a volatile memory or a nonvolatile memory. According to an embodiment, the interface may include, for example, a high definition multimedia interface (HDMI), a universal serial bus USB) interface, an SD card interface, and/or an audio interface. For example, the interface may electrically or physically connect the electronic device 300 and an external electronic device to each other, and may include a USB connector, an SD card/MMC connector, or an audio connector. According to an embodiment, the battery 350 is a device for supplying a power to at least one constituent element, and may include, for example, a non-rechargeable primary cell, a rechargeable secondary cell, or a fuel cell. At least a part of the battery 350 may be disposed on, for example, substantially the same plane as the at least one substrate 341 and 342. According to an embodiment, the battery 350 may be disposed in a manner that it is built in the electronic device 300. In a certain embodiment, the battery 350 may be detachably disposed from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. The antenna may be formed by a part or combination of the lateral bezel structure 310 and/or the first support member 311. In certain embodiments, the electronic device 300 may further include a digitizer for detecting an external electronic pen.

An electronic device and a housing assembly of the electronic device as described hereinafter may be the electronic device 101, 200, and 300 described in FIGS. 1, 2A, 2B, and 3. The electronic device may be disposed in a plane defined by two directions crossing each other, such as the X direction and the Y direction. A thickness of the electronic device and various components or layers thereof may be defined in a direction intersecting the plane (e.g., the Z direction).

The housing assembly may be understood to collectively refer to constituent elements which form an appearance (e.g., an outer appearance) of the electronic device, and which form or support a space in which various electrical parts (electronic components) and mechanical parts included in the electronic device are disposed. Here, the "electrical part" may mean a constituent element, which includes at least one active element or passive element, and operates through reception of an electrical signal (e.g., control signal or electric power). The electrical part may include, for example, an electronic component and a printed circuit board (PCB) on which the electronic component is disposed. Further, the "mechanical part" is a constituent element excluding the electrical part, and may mean various kinds of constituent elements (e.g., bracket, plate, mold structure, and/or sealing structure) which assist in supporting the electrical part.

Prior to description, directions mentioned hereinafter will be defined. In the following description, a first direction may mean a front direction of the electronic device. With reference to the drawing, the first direction may be +Z direction of FIG. 2A. In the following description, a second direction may mean a rear direction of the electronic device. With reference to the drawing, the second direction may be −Z direction of FIG. 2A.

Figure 4A:
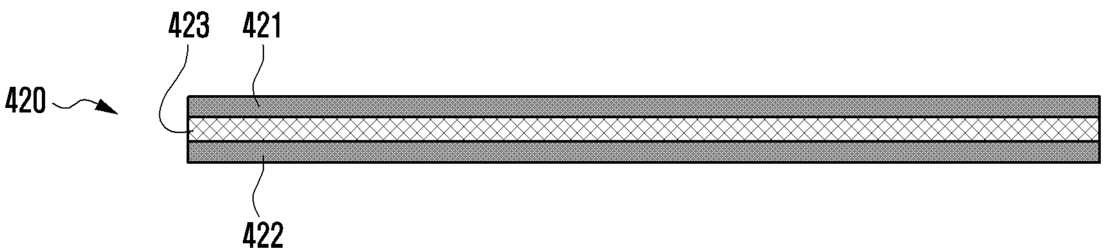
FIG. 4A is a cross-section view of an adhesive member not including a cushion layer according to various embodiments disclosed in this document.
Figure 4B:
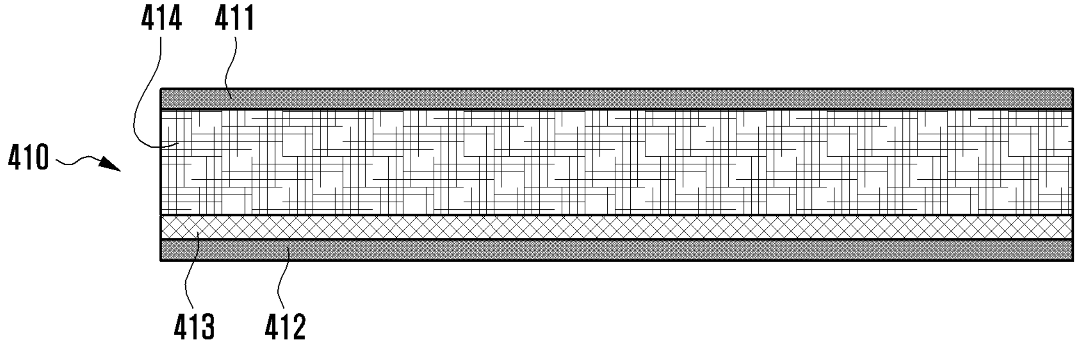
FIG. 4B is a cross-section view of an adhesive member including a cushion layer according to various embodiments disclosed in this document.
Figure 5A:
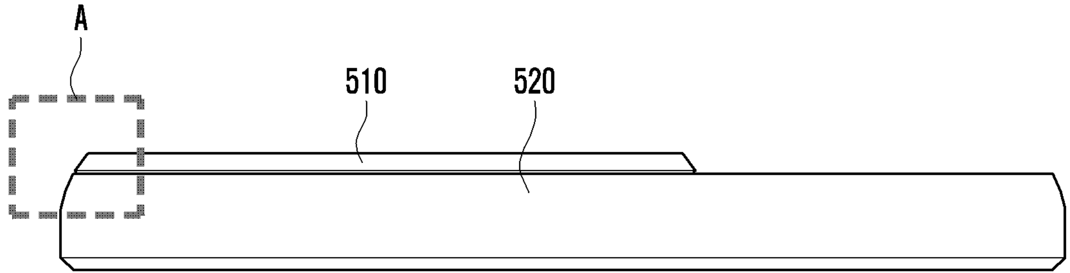
FIG. 5A is a side view of an electronic device including an adhesive member including a cushion layer.
Figure 5B:
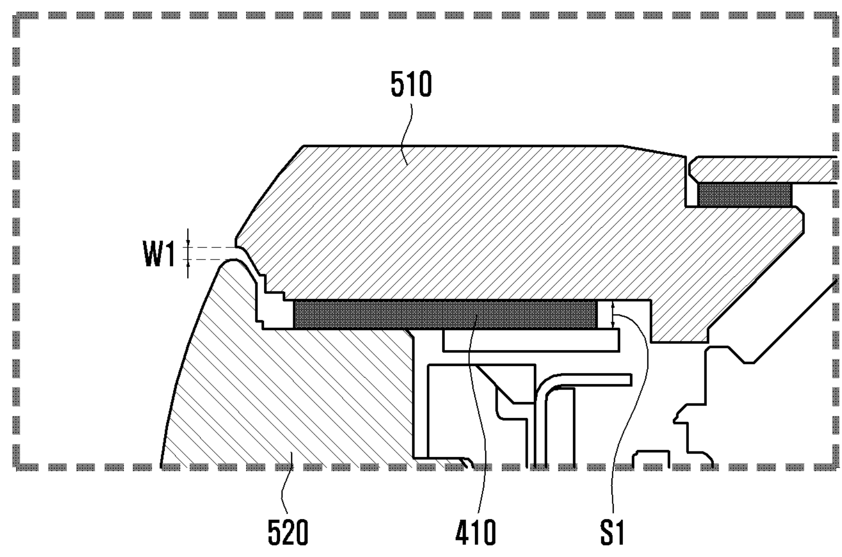
FIG. 5B is an enlarged side view of region A of FIG. 5A.
Figure 6A:
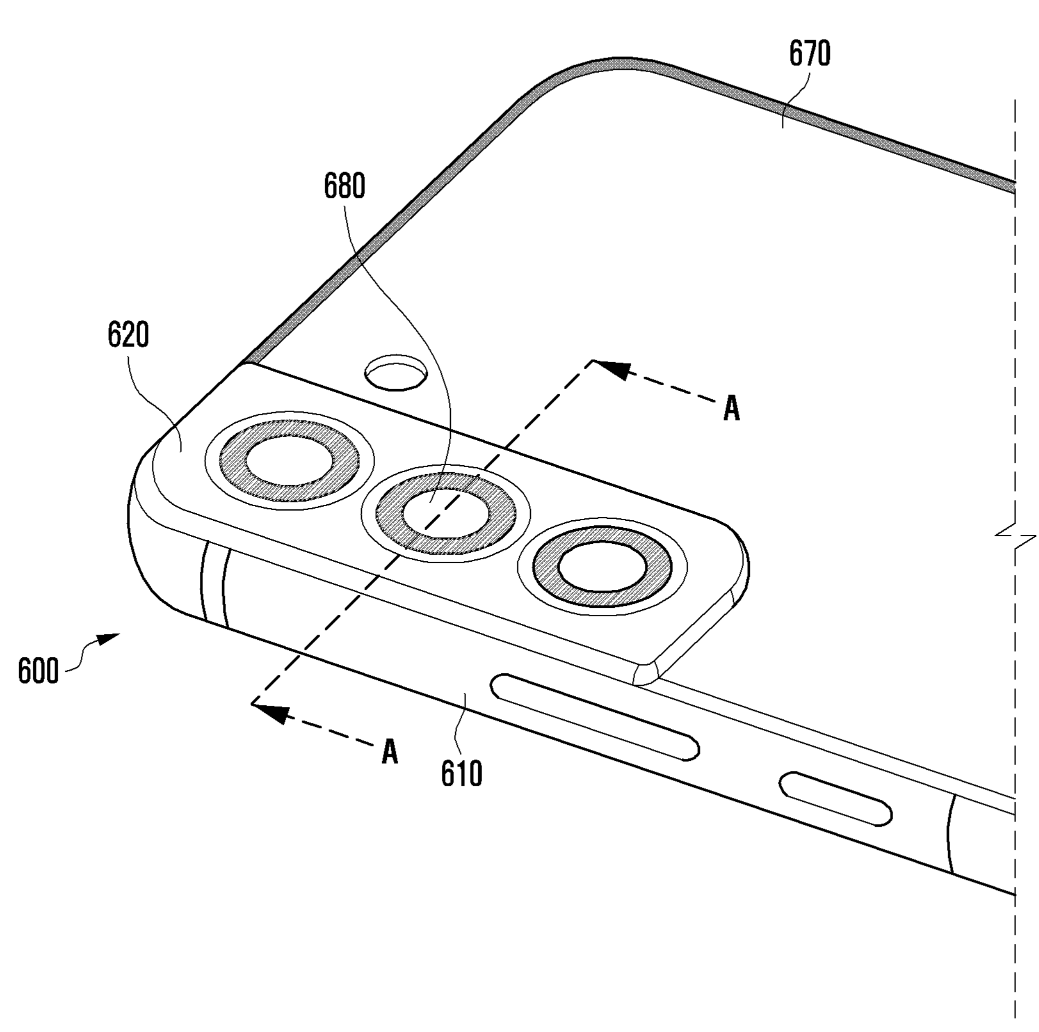
FIG. 6A is an enlarged perspective view of a part of a rear surface of an electronic device according to various embodiments disclosed in this document.
Figure 6B:
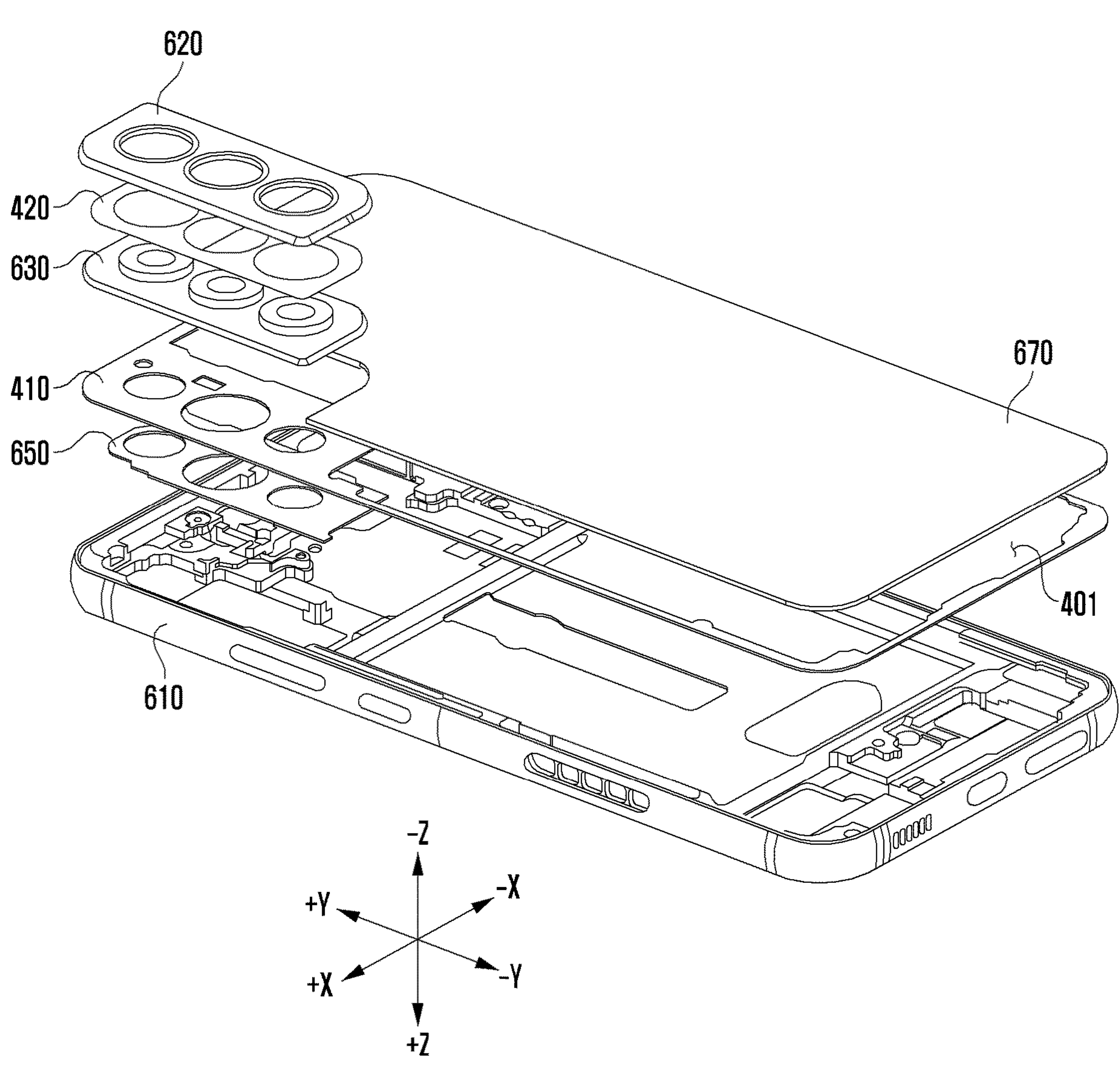
FIG. 6B is a separated perspective view of an electronic device illustrated in FIG. 6A.
Figure 6D:
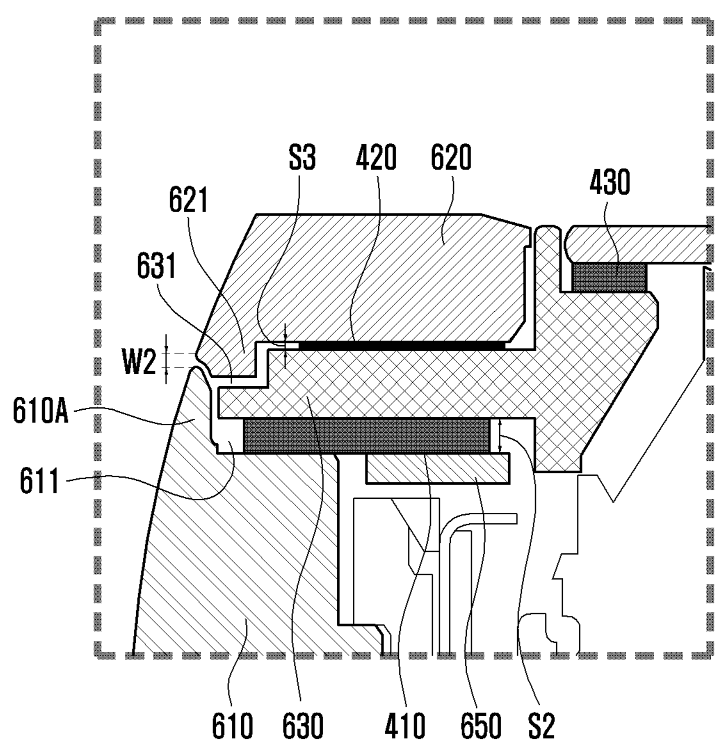
FIG. 6D is an enlarged cross-sectional view of region B in FIG. 6C.

FIG. 4A is a cross-section view of an adhesive member not including (e.g., excluding) a cushion layer according to various embodiments disclosed in this document. FIG. 4B is a cross-section view of an adhesive member including a cushion layer according to various embodiments disclosed in this document. FIG. 5A is a side view of an electronic device including an adhesive member including a cushion layer. FIG. 5B is an enlarged view of region A in FIG. 5A. FIG. 6A is a perspective view of a part of a rear surface of an electronic device according to various embodiments disclosed in this document. FIG. 6B is a separated perspective view of an electronic device illustrated in FIG. 6A. FIG. 6C is a cross-sectional view of an electronic device illustrated in FIG. 6A cut along line A-A. FIG. 6D is an enlarged view of region B in FIG. 6C.

According to various embodiments, a housing assembly may include a frame 610, a support member 630, an internal member 650, and a cover member 620. The above-described constituent elements of the housing assembly are merely exemplary, and besides them, may be changed in various ways.

The housing assembly may be formed of or include various materials. For example, the housing assembly may be formed of various materials, such as metal, metal alloy, carbon, synthetic resin, glass, and composite material. In case that the housing assembly is constituted through mutual combination or connection of a plurality of constituent elements, the constituent elements constituting the housing assembly may be formed of the same material or different materials.

The plurality of constituent elements included in the housing assembly may be mutually combined (e.g., combined with each other) in various ways. For example, the plurality of constituent elements may be mutually combined with each other by an adhesive member 410 and 420 having an adhesive property. The adhesive member 410 and 420 may be constituted by a plurality of layers.

With reference to FIG. 4A, in case of the adhesive member 420, it may include a structure in which adhesive layers 421 and 422 are disposed on both surfaces of a base layer 423 made of a synthetic resin material (e.g., PET or PU).

With reference to FIG. 4B, in case of the adhesive member 410 including a waterproof function, a cushion layer 414 may be laminated on one surface of the base layer 413. Adhesive layers 411 and 412 may be laminated on the other surface of the base layer 413 and one surface of the cushion layer 414, respectively. The cushion layer 414 may enable the adhesive member 410 to be contracted from an initial shape or thickness, and/or restored to the initial shape or thickness. Thus, the cushion layer 414 may block foreign substances or moisture which may flow in between the constituent elements of the electronic device which are bonded to each other by the adhesive member 410. The adhesive member 410 may have first and second surfaces opposite to each other along a thickness direction (e.g., the Z direction). Such surfaces may be considered major surfaces of the adhesive member 410. Constituent elements of the electronic device may extend along or face a major surface, such as to be coupled to the adhesive member 410 at the major surface.

The adhesive member 410 including the cushion layer 414 may require a compression process for bonding of the adhesive member 410. The compression process may be understood as a process of compressing the constituent elements of the electronic device and the adhesive member 410, so that the adhesive layers 411 and 412 included in the adhesive member 410 and the constituent elements being bonded by the adhesive member 410 can be bonded together with sufficient adhesive force. In case of the adhesive member 410 including the cushion layer 414, the cushion layer 414 may be deformed in the compression process. Accordingly, the compression process is performed in consideration of the deformation of the cushion layer 414. Thus, larger compression displacement (distance change between two constituent elements bonded by the adhesive member 410 in the compression process) than the adhesive member 420 which does not include the cushion layer 414 may be required. In case of the adhesive member 420 which does not include the cushion layer 414, the compression process may not be required, or sufficient bonding may be made only with a smaller compression displacement.

Hereinafter, in order to distinguish the adhesive member depending on existence/nonexistence of the cushion layer 414, the adhesive member including the cushion layer 414 is called the first adhesive member 410, and the adhesive member which does not include the cushion layer 414 is called the second adhesive member 420. Since the first adhesive member 410 includes the cushion layer 414, it may be formed or provided with an overall thickness which is larger than the overall thickness of the second adhesive member 420. In an embodiment, the first adhesive member 410 may have a total (or overall) thickness of about 2 millimeters (mm) to about 5 mm. In an embodiment, the second adhesive member 420 may have a total (or overall) thickness of about 0.01 millimeter mm to about 1.5 mm. The total thickness of a respective adhesive member may indicate an initial thickness, such as a thickness before compression and/or a restored thickness after compression force is removed and the respective adhesive member is uncompressed or restored.

According to various embodiments, as illustrated in FIG. 6B, in consideration of the waterproof function of the electronic device 600, the first adhesive member 410 may be formed in a closed loop shape. That is, a discrete opening is defined in the first adhesive member 410, such as penetrating a partial thickness portion or a complete thickness portion. The discrete opening is surrounded by a solid portion (or a material portion) of first adhesive member 410, such that the opening is totally surrounded in the plan view by some solid/material portion of the first adhesive member 410. Where the opening penetrates a complete thickness of a layer, it may be open to both of opposing sides of such layer.

A discrete opening may include a space 401 (e.g., a first through-opening) which penetrates a total thickness of the first adhesive member 410, as shown in FIG. 6B. Since external moisture and foreign substances may not flow into a space 401 surrounded by a solid/material portion of the first adhesive member 410, various mechanical parts of the electronic device 600 may be disposed in the space 401 surrounded by the solid/material portion of the first adhesive member 410 to achieve the waterproof function.

As illustrated in FIGS. 5A and 5B, in case of bonding two constituent elements 510 and 520 which form the appearance of the electronic device, to each other with the first adhesive member 410, a separation space S1 may be required between the two constituent elements 510 and 520 in consideration of the compression process. This separation space S1 may correspond to the minimum compression displacement being required in the compression process for achieving bonding between the two constituent elements 510 and 520 of the housing assembly.

Along a thickness direction (e.g., vertical in FIGS. 5A and 5B), the two constituent elements 510 and 520 approach each other in the compression process, and restoration of the first adhesive member 410 after removal of compression force in completion of the compression process, a gap W1 as much as the separation space S1 may be formed between the two constituent elements 510 and 520. This gap W1 may deteriorate the aesthetic sense of the electronic device. Further, foreign substances may flow into the gap W1, from outside the electronic device. The foreign substances flowing into the gap W1 may become fixed, or the volume defined by the gap W1 may be increased, so that the physical distance between the two constituent elements may be increased, and the bonding force between the constituent elements may be weakened.

In various embodiments disclosed in this document, the waterproof function can be achieved by using the first adhesive member 410 as well as providing the housing assembly having a reduced gap W1 between the constituent elements 510 and 520 as illustrated in FIGS. 5A and 5B.

With reference to FIGS. 6A to 6D, the frame 610 may constitute at least a part of an outer appearance of the side surface of the electronic device 600. A seating part 611 may be formed on the frame 610. As illustrated in FIG. 6C, the seating part 611 may include a recess concavely formed at a location spaced apart from an outer surface of the frame 610 in one direction. The seating part 611 may include a portion concavely formed in a first direction (e.g., −Z direction of FIGS. 6B and 6C). Since the seating part 611 is concavely formed at the outer surface of the frame 610, it may be formed in the form of being surrounded or defined by a portion of the frame 610. The portion of the frame 610 which surrounds the seating part 611 may be called a frame partition 610A. In an embodiment, the frame partition 610A which is one portion of the frame 610 which surrounds the seating part 611 may be called a sidewall and a seating surface may extend from the sidewall to form a step of the frame 610 at an end portion thereof. The sidewall (e.g., the frame partition 610A may be coplanar with the first adhesive member 410. For example, the frame partition 610A (or frame side wall) may be formed to surround the seating part 611 at least partly, and to protrude in a second direction (e.g., +Z direction of FIG. 6C) from the seating part 611.

With reference to FIGS. 6B and 6C, an internal member 650 may be disposed in a medial direction of the frame 610. The frame 610 and the internal member 650 may form a seating part for a functional component of the electronic device. In an embodiment, as the seating part, a camera seating part 613 which accommodates a camera module 700 included in the electronic device 600. The camera seating part 613 formed by the frame 610 together with the internal member 650 may be formed in a shape corresponding to an external shape of the camera module 700 (e.g., camera module 180 of FIG. 1), and may support the camera module 700 accommodated in the camera seating part 613.

In an embodiment, the first adhesive member 410 may be bonded to the frame 610 at the seating part 611 thereof and to the internal member 650. With reference to FIG. 6C and 6D, a part of the first adhesive member 410 bonded to the seating part 611 may be hidden by the frame partition 610A. For example, by forming the frame partition 610A with a height along the Z direction which is larger than the thickness of the first adhesive member 410, the first adhesive member 410 can be hidden by the frame partition 610A in a side surface direction (e.g., +X direction of FIG. 6C). That is, visibility of the first adhesive member 410 from outside the electronic device is blocked by the frame partition 610A.

As illustrated in FIG. 6C, by the first adhesive member 410 bonded to the seating part 611 and the internal member 650, the support member 630 disposed in the second direction (e.g., +Z direction of FIG. 6C) may be fixed onto the frame 610. With reference to FIG. 6C, the seating part 611 and the internal member 650 of the frame 610 may be bonded to the first adhesive member 410 at a same side or same major surface of the first adhesive member 410, such as a lower surface of the first adhesive member 410. The support member 630 may be bonded to the first adhesive member 410 at an opposing surface which is opposite to the same side or same major surface of the first adhesive member 410, such as an upper surface which is opposite to the lower surfaces. As illustrated in FIG. 6C, At an opposite side of an enclosed opening of the cover member 620, a rear cover 670 may be bonded to the first adhesive member 410 at the other surface (e.g., the upper surface) of the first adhesive member 410, where the rear cover constitutes at least a part of an outer appearance of the rear surface of the electronic device 600.

In an embodiment, between the seating part 611 and the support member 630 which are bonded to each other by the first adhesive member 410, a first separation space S2 (e.g., a separation distance or a separation gap) may be formed. This first separation space S2 may be a space for accommodating compression of the first adhesive member 410 by the compression process for compressing the first adhesive member 410 so that the adhesive member 410 can be stably bonded to the both the seating part 611 and the support member 630. In order for the first adhesive member 410 to be bonded to the seating part 611 and the support member 630 with sufficient bonding force, the first adhesive member 410 may be compressed while being in contact with the opposing constituent elements (e.g., the the seating part 611 and the support member 630, for example). In this compression process, the first adhesive member 410 can be compressed and pressed to respective surfaces of the opposing constituent elements. Thus, the first separation space S2 to accommodate the reduced thickness of the compressed adhesive member may be required between the seating part 611 and the support member 630 so that the seating part 611 and the support member 630 do not interfere with each other due to the compression of the first adhesive member 410. The first separation space S2 may define a minimum separation space between constituent elements which are bonded to each other by a compressible adhesive member.

With reference to FIG. 6C, the first separation space S2 between the seating part 611 and the support member 630 may be hidden (e.g., un-visible from outside the electronic device along the X direction) by the frame partition 610A in the side surface direction. Accordingly, the first separation space S2 between the seating part 611 and the support member 630 cannot be seen from the outside of the electronic device 600. Further, since the seating part 611 and the support member 630 are combined with each other at portions of the first adhesive member 410 including the cushion layer 414, the foreign substances and moisture flowing between the seating part 611 and the support member 630 can be blocked by the first adhesive member 410.

In an embodiment, the cover member 620 may be disposed on the support member 630 in the second direction so as to cover the support member 630. The cover member 620 and the support member 630 may be combined with each other by the second adhesive member 420. The second adhesive member 420 is an adhesive member 420 which does not have the cushion layer 414. To attach constituent members to each other with the second adhesive member 420, a compression process for bonding of the second adhesive member 420 may not be required, or the compression process may be performed with a very small compression displacement (e.g., less than a displacement distance related to the first adhesive member 410). In an embodiment, for example, the second adhesive member 420 may be an adhesive member having a thickness which is smaller than the thickness of the first adhesive member 410. Accordingly, the interval along a compression direction of an adhesive member between constituent elements as the cover member 620 and the support member 630 may be smaller than the interval along a compression direction of an adhesive member between the support member 630 and the frame 610. Accordingly, between the cover member 620 and the support member 630, a second separation space S3 may not be required, or only a separation distance of a very low level may be required. For example, the separation distance S3 between the cover member 620 and the support member 630 may be smaller than the separation distance S2 between the support member 630 and the seating part 611.

Since the support member 630 and the cover member 620 are combined with each other at an edge portion of the electronic device by the second adhesive member 420 which does not require or minimizes the compression process, and the support member 630 is disposed on the seating part 611 concavely formed on the frame 610, the gap W2 at the outer edge portion between the frame partition 610A (e.g., a first housing member or front housing member) and the cover member 620 (e.g., a second housing member or rear housing member) may be smaller than that in the case as described above with reference to FIG. 5B (gap W1 between two constituent elements 510 and 520 bonded to each other by the first adhesive member 410 having the cushion layer 414). By reducing the gap W2 between the frame 610 and the cover member 620 which form the appearance of the electronic device 600 at an outer edge thereof, the aesthetic sense of the electronic device 600 can be improved. Further, it may be difficult for the foreign substances to flow in between the cover member 620 and the frame 610 from outside the electronic device to inside thereof through the reduced-height of the gap W2. That is, even though the separation distance S2 may be increased to accommodate a displacement distance by which the first adhesive member 410 is compressed, the stepped shape of the frame 610 at the sealing part 611 on which the first adhesive member 410 and the support member 630 are disposed, allows the cover member 620 to be disposed closer to an upper end of the frame 610 at the frame partition 610A and reduce the gap W2.

In an embodiment, in a portion adjacent to the frame partition 610A, a part 631 of the support member 630 may be formed with a thickness which is smaller than the thickness of other portions or a remaining portion thereof, to provide a stepped shape. For example, as illustrated in FIG. 6C, in case that the outer end of the cover member 620 is rounded to correspond to an external shape of the frame 610, the thickness of the cover member 620 may be reduced in a direction toward the end of the cover member 620. Since the support member 630 is formed with a relatively thin thickness in the portion adjacent to (or closest to) the frame partition 610A, the thickness of an end portion 621 of the cover member 620 can be secured, and thus the stiffness of the end portion 621 of the cover member 620 can be secured.

According to various embodiments, referring to FIG. 6C, the cover member 620 may overlap the rear cover 670 bonded to the first adhesive member 410.

In an embodiment, with reference to FIG. 6C, a window member 680 which faces a lens part 710 of the camera module 700 may be bonded to the support member 630. The window member 680 as a light transmissive portion of the housing assembly may be formed of a transparent material at least partly so that external light can be incident to the lens part 710. The window member 680 may be bonded to the support member 630 through a third adhesive member 430. In an embodiment, the third adhesive member 430 may be an adhesive member including the cushion layer 414 so as to have the waterproof function in a similar manner as the first adhesive member 410.

As described above, although the portion which supports the camera module 700 of the housing assembly of the electronic device 600 has been described as an example, the above-described structure may be applied to other various portions constituting the external shape or the outer appearance of the electronic device. In case that a recess or step is variously formed one or more housing assembly members to hide the first adhesive member 410 which requires the compression process, the constituent element (e.g., the support member 630) as a third housing member bonded to the first adhesive member 410 is covered, and the constituent element (e.g., the cover member 620) as a second housing member or lens cover which is bonded to the constituent element bonded to the first adhesive member 410 is constituted to form the appearance of the electronic device, the gap between the second housing member and a first housing member (e.g., the frame 610) of the assembled electronic device can be reduced even while using the first adhesive member 410 implementing the waterproof function.

FIGS. 7A to 7D are views explaining an assembling process of an electronic device according to various embodiments disclosed in the present document. FIG. 8 is a cross-sectional view explaining an assembling process of an electronic device according to various embodiments disclosed in the present document.

A process of assembling an electronic device to be described hereinafter is merely exemplary to help understanding of the disclosure, and the contents, such as an assembling order and assembling method, may be changed in various ways. Further, the same reference numeral will be used for the same constituent element as the constituent element as described above through the drawings, and the detail description thereof will be omitted.

Figure 7A:
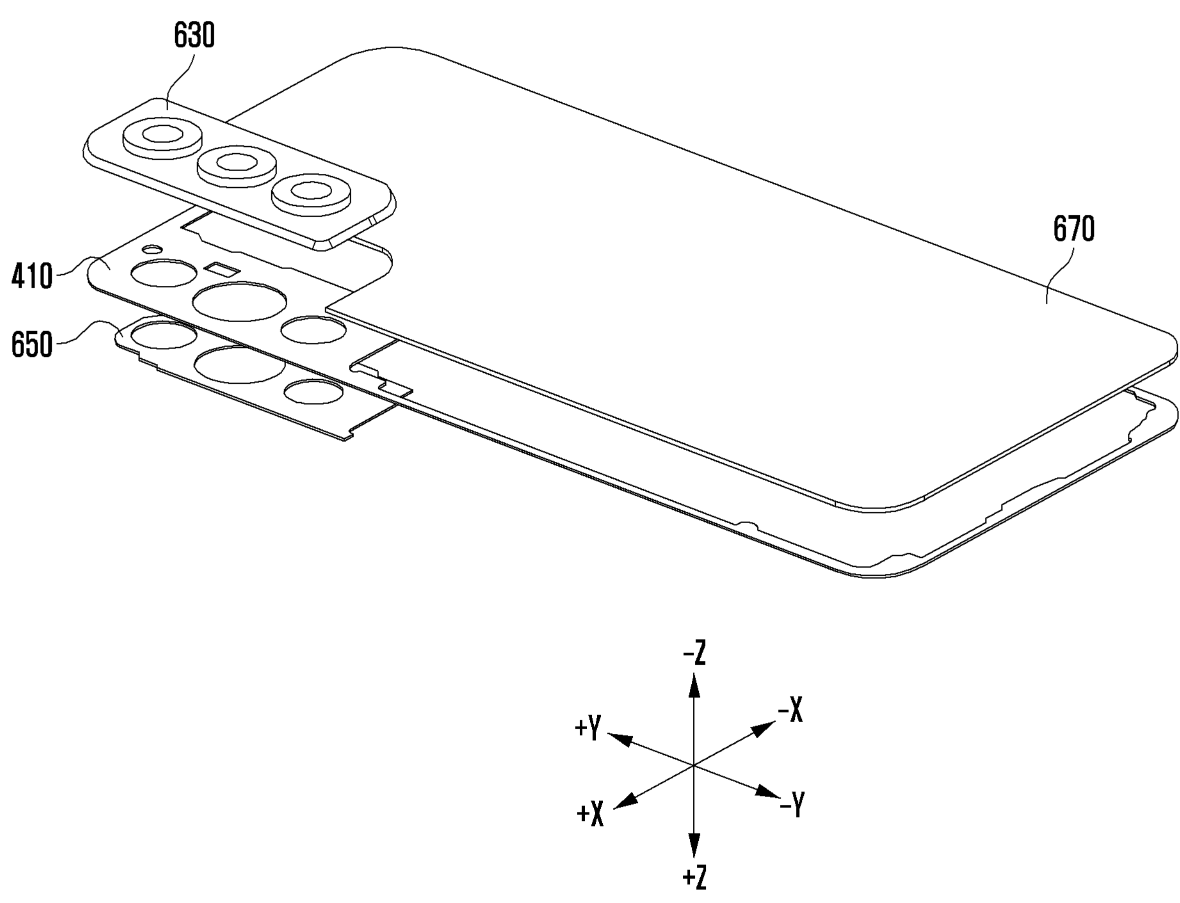
FIGS. 7A to 7D are views explaining an assembling process of an electronic device according to various embodiments disclosed in the present document.
Figure 7B:
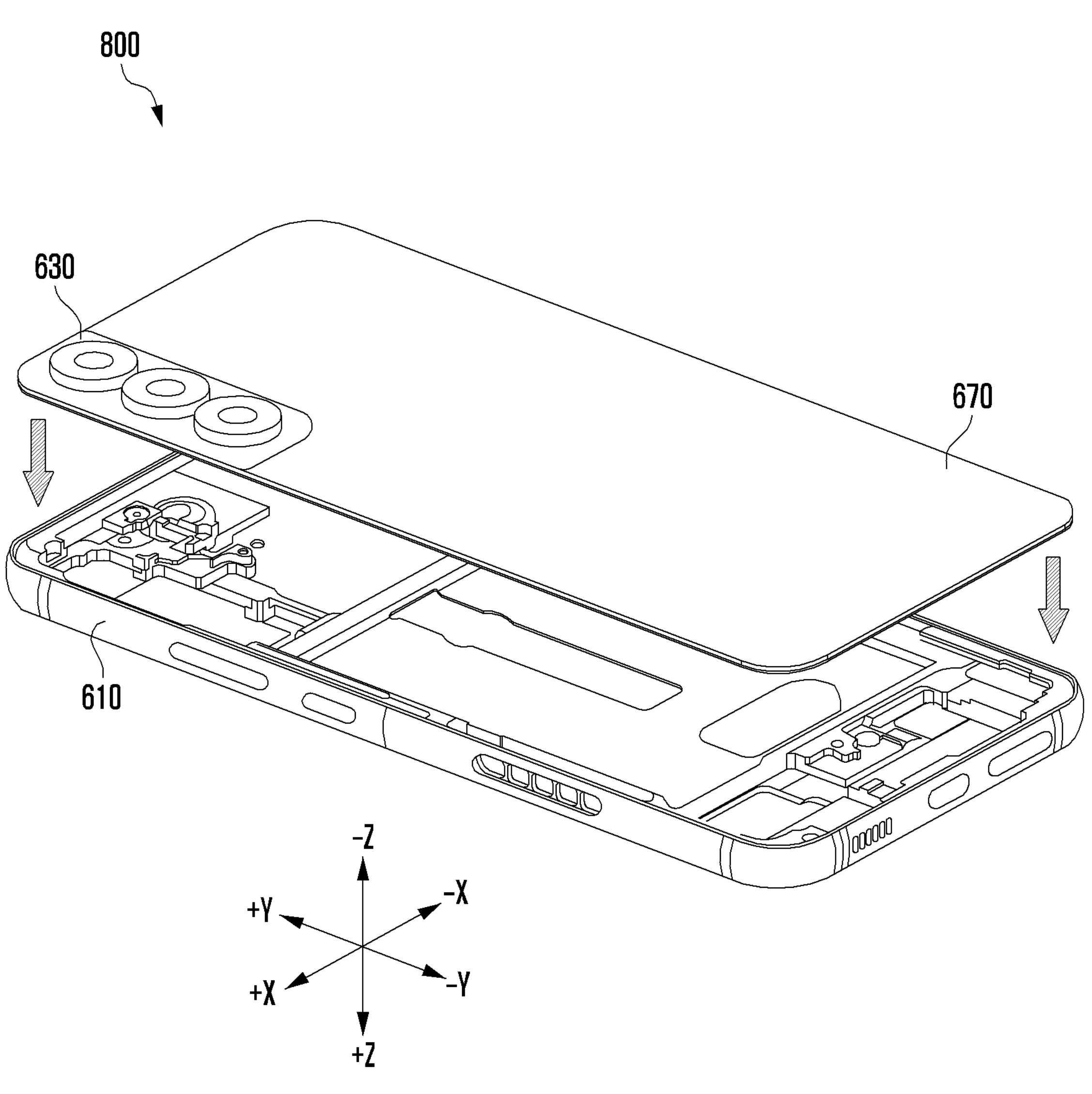
Figure 8:
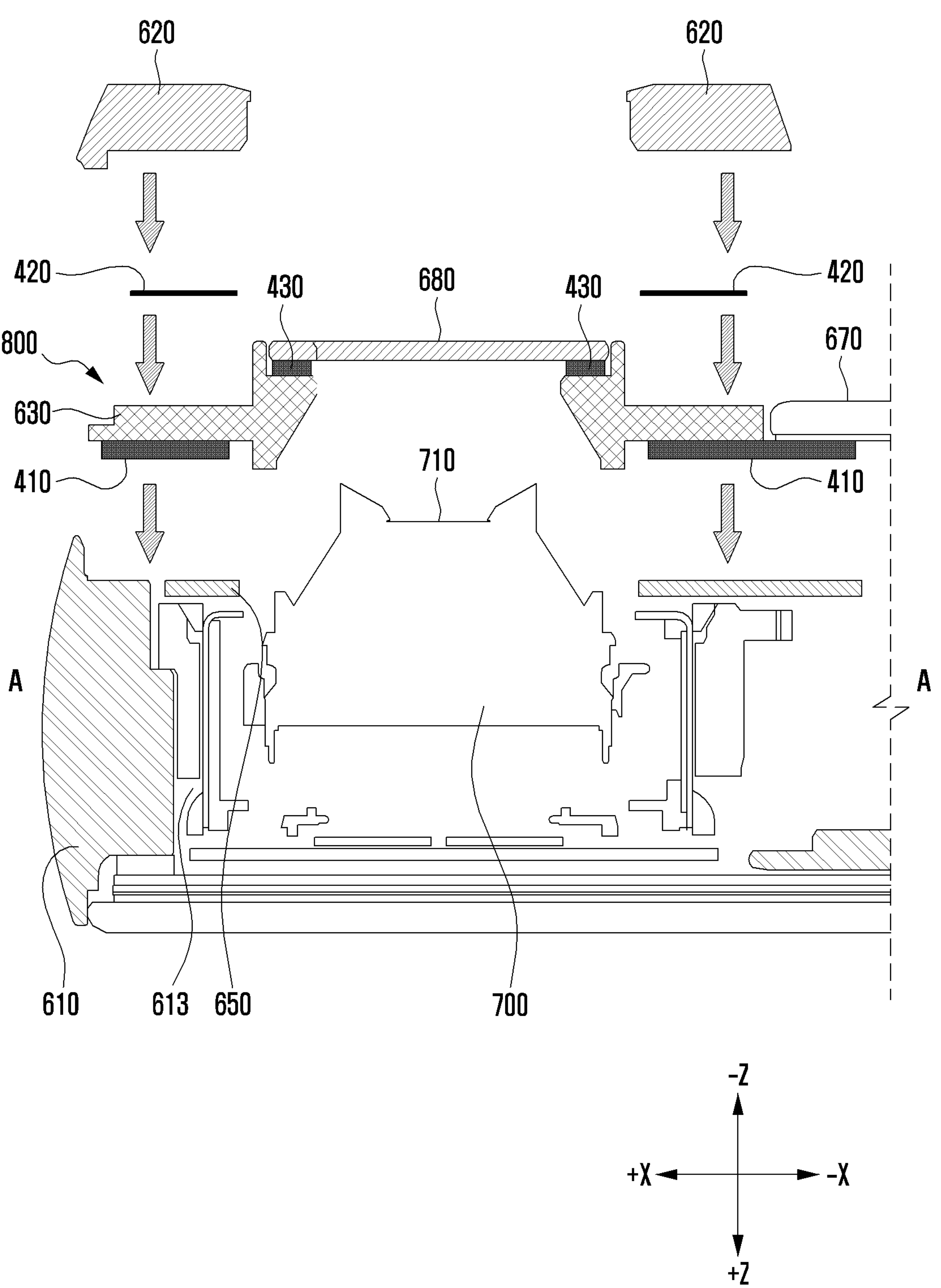
FIG. 8 is a cross-sectional view explaining an assembling process of an electronic device according to various embodiments disclosed in the present document.

In an embodiment, as illustrated in FIGS. 7A and 7B, the support member 630, the rear cover 670, the first adhesive member 410, and the internal member 650 may be combined with each other. The support member 630 and the rear cover 670 may be bonded to one surface (e.g., surface directed in −Z direction of FIG. 7A) of the first adhesive member 410, and the internal member 650 may be bonded to the other surface (e.g., surface directed in +Z direction of FIG. 7A) of the first adhesive member 410.

As illustrated in FIG. 7B, a preliminary assembly 800 composed of the support member 630, the rear cover 670 and the internal member 650 each bonded to the first adhesive member 410 may be attached to the frame 610 (e.g., a lower housing). As the frame 610 is attached to the first adhesive member 410 at the other surface of the first adhesive member 410, the preliminary assembly 800 attached to the first adhesive member 410 at an opposing surface thereof, may be bonded to the frame 610 via the first adhesive member 410.

The first adhesive member 410 is an adhesive member including the cushion layer, and in the process in which the first adhesive member 410 is bonded to the frame 610, a process of pressing the preliminary assembly 800 onto the frame 610 by a compression force may be required. By the compression force, the first adhesive member 410 may be compressed to reduce a thickness thereof and bring the preliminary assembly 800 and the frame 610 closer to each other.

With reference to FIG. 8, the first adhesive member 410 may be bonded to the frame 610 at the seating part of the frame 610. In this case, since the outer surface of the preliminary assembly 800 does not overlap the partition of the frame 610 in an assembling direction (e.g., downward arrows in FIG. 8), the assembly 800 does not interfere with the partition of the frame 610. Thus, it is possible to press the assembly 800 onto the frame 610 without interference. The assembly 800 can be sufficiently pressed onto the frame 610, by the compression force) so that the first adhesive member 410 and all the elements attached thereto of the preliminary assembly 800 can be sufficiently bonded to the frame 610.

Figure 7C:
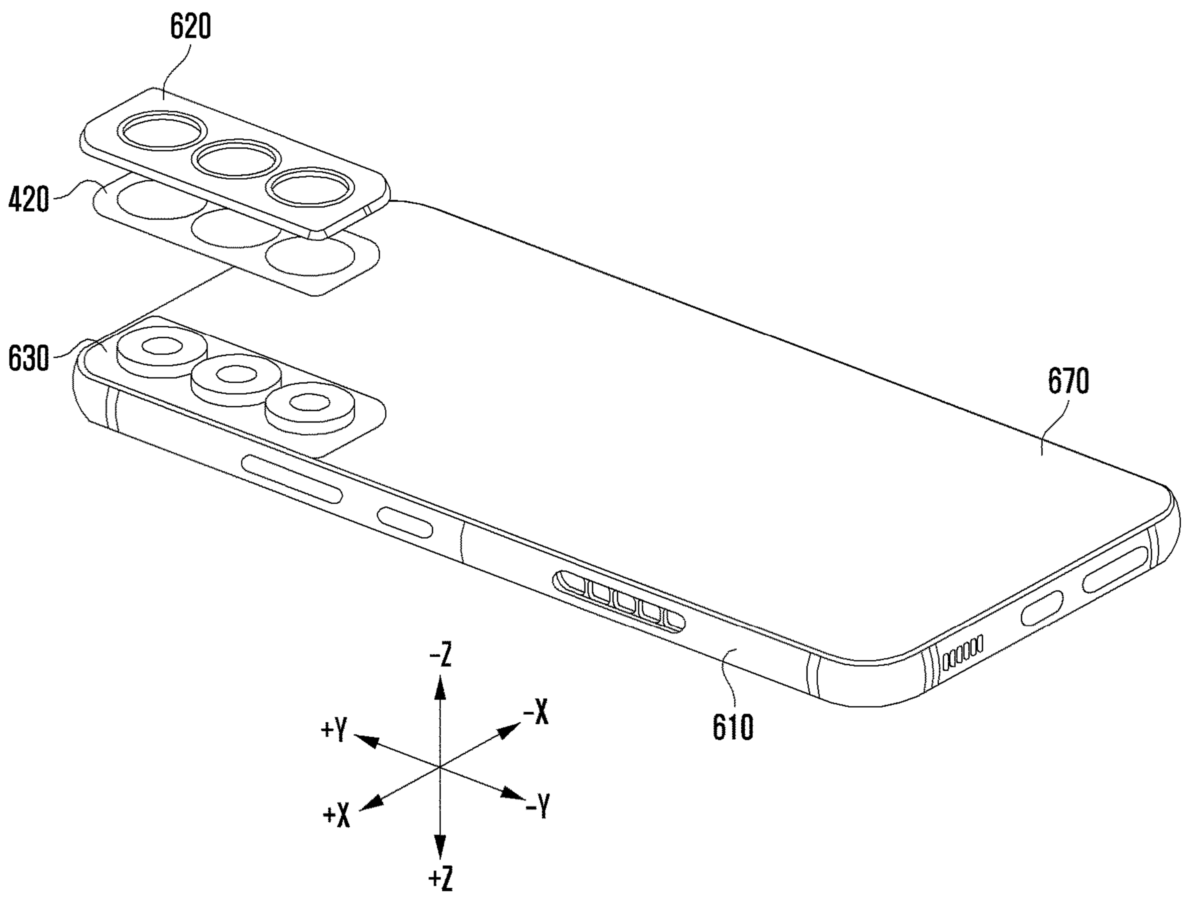
Figure 7D:
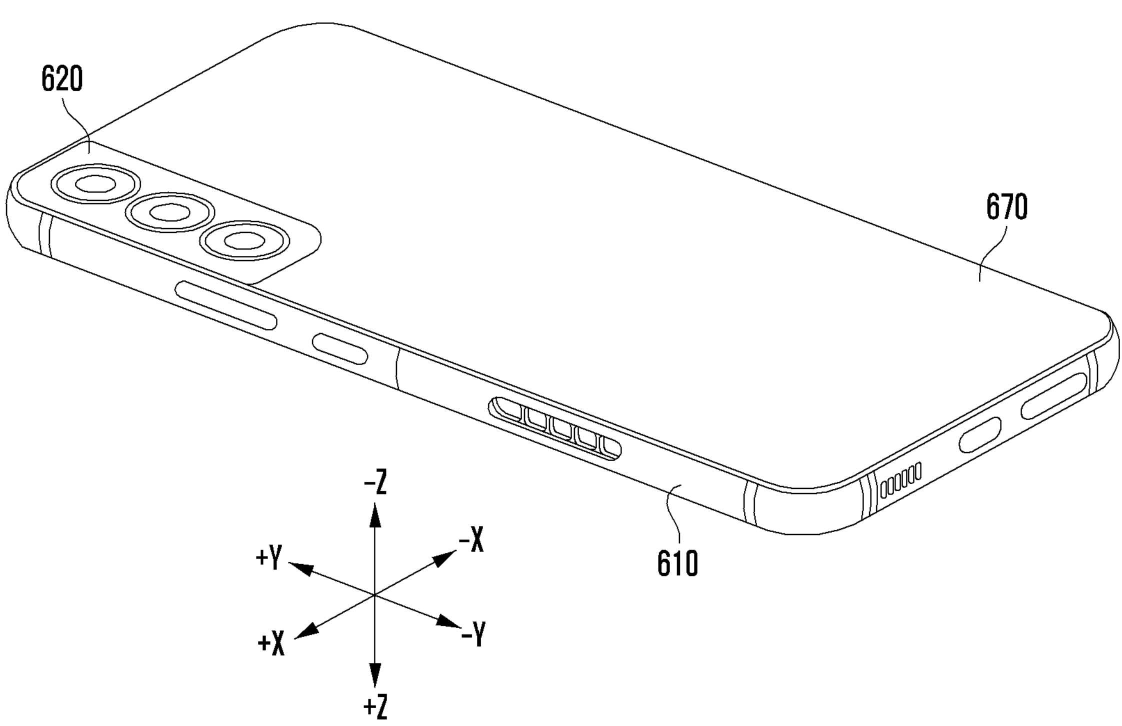

If the combination of the preliminary assembly 800 and the frame 610 with each other is completed, as illustrated in FIGS. 7C and 7D, the cover member 620 can be bonded to the support member 630 through the second adhesive member 420. Referring to FIG. 6C, for example, removal of the compression force after the combination of the preliminary assembly 800 and the frame 610 with each other is completed may define the gap W2. In the combination shown in FIGS. 7C and 7D, the support member 630 and the rear cover 670 are exposed.

Since the second adhesive member 420 is an adhesive member which does not include the cushion layer, in the process of bonding the cover member 620 to the support member 630 through the second adhesive member 420, unlike the process of bonding the first adhesive member 410 onto the frame 610, the compression process may not be required, or the cover member 620 may be bonded to the support member 630 with a relatively small displacement compression and/or compression force. Accordingly, the interval between the cover member 620 and the support member 630 combined with each other through the second adhesive member 420 may be smaller than the interval between the support member 630 and the frame 610 combined with each other through the first adhesive member 410 owing to the larger compression distance thereof.

In an embodiment disclosed in this document, since the partition of the frame 610 hides the final interval between the support member 630 and the frame 610 so as not to be seen from the outside (e.g., outside of the electronic device 600), and the upper interval between the support member 630 and the cover member 620 is smaller than the lower interval between the support member 630 and the frame 610 as described above, the final gap of the electronic device 600 which forms the outer appearance of the electronic device can be reduced.

The electronic device according to various embodiments disclosed in this document (e.g., electronic device 101 of FIG. 1, electronic device 200 of FIGS. 2A and 2B, electronic device 300 of FIG. 3, and electronic device 600 of FIG. 6A) may include a frame (e.g., frame 610 of FIG. 6A) configured to form at least a part of an appearance of the electronic device, a seating part (e.g., seating part 611 of FIG. 6C) concavely formed in a first direction at a location spaced apart from an outer surface of the frame, a first adhesive member (e.g., first adhesive member 410 of FIG. 6C) bonded onto the seating part and including a cushion layer (e.g., cushion layer 414 of FIG. 4B), a support member (e.g., support member 630 of FIG. 6C) accommodated on the seating part in the first direction and bonded to the first adhesive member, a second adhesive member (e.g., second adhesive member 420 of FIG. 6C) bonded to the support member, and a cover member (e.g., cover member 620 of FIG. 6C) configured to form the appearance of the electronic device and disposed on the second adhesive member in a second direction opposite to the first direction, so that a location with respect to the support member is fixed by the second adhesive member.

In an embodiment, the electronic device includes a housing which forms an outer appearance of the electronic device (for example, one or more among elements 610, 630, 620, 680 and 670), the housing including a frame 610 including a step 611 at an end portion of the frame 610, and a cover member 620 which faces the step of the frame 610, a support member 630 which is between the step of the frame and the cover member and is bonded to the frame and to the cover member, and adhesive members which bond the support member 630 to the housing (for example, one or more among elements 410, 420 and 430), the adhesive members including a first adhesive member 410 which includes a cushion layer 414 and bonds the support member 630 to the frame 610, at a seating surface 611 of the step, and a second adhesive member 420 which bonds the support member 630 and the cover member 620 to each other.

Further, the seating part may be formed with a thickness which is thicker than a thickness of the first adhesive member so that the first adhesive member is hidden by the outer surface of the frame. Here, the frame 610 may further include a sidewall 610A and the seating surface which extends from the sidewall to define the step 611, the first adhesive member 410 being bonded to the frame at the seating surface. At the step 611, the sidewall 610A extends further from the seating surface than first adhesive member 410 (e.g., along the thickness direction).

Further, a distance between the support member and the cover member coupled by the second adhesive member may be smaller than a distance between the seating part and the support member coupled by the first adhesive member.

Further, the electronic device may further include an internal member (e.g., internal member 650 of FIG. 6C) disposed on an inside of the frame. Here, the internal member 650 may be adjacent to the seating surface (at 611) of the frame, at an inside of the frame 610.

Further, the first adhesive member may be bonded to the seating part and the internal member. Here, the first adhesive member 410 is bonded to the frame 610 at the seating surface 611 and to the internal member 650 which is adjacent to the seating surface.

Further, the electronic device may further include a camera module (e.g., camera module 700 of FIG. 6C), and the camera module may be accommodated in a camera seating part (e.g., camera seating part 613 of FIG. 6C) formed by the frame and the internal member. Here, the frame 610 may extend from the internal member 650, in a direction away from the first adhesive member 410 (e.g., along the thickness direction towards a front of the electronic device), to define a camera seating area 613, and a camera 700 may be accommodated in the camera seating area 613.

Further, the electronic device may further include a window member (e.g., window member 680 of FIG. 6C) at least partly formed of a transparent material, and attached to the support member in the second direction so as to face a lens part (e.g., lens part 710 of FIG. 6C) of the camera module. Here, the camera 700 may include a lens 710, and the housing may further include a transparent window 680 which faces the lens of the camera.

Further, the window member may be bonded to the support member by a third adhesive member (e.g., third adhesive member 430 of FIG. 6C).

Further, the third adhesive member may include a cushion layer. Here, the adhesive members may include cushion adhesive layers respectively including the cushion layer 414, and such cushion adhesive layers may include the first adhesive member 410 and the third adhesive member 430 among the first adhesive member 410, the second adhesive member 420 and the third adhesive member 430. The cushion adhesive layers may not include the second adhesive member 420 among the first adhesive member 410, the second adhesive member 420 and the third adhesive member 430.

Further, the cover member may be disposed so that at least a part of the cover member covers a rear cover (e.g., rear cover 670 of FIG. 6C) disposed on a rear surface of the electronic device. Here, the housing may further include a rear cover 670 adjacent to the cover member 620 at a rear of the electronic device. The cover member may face the step 611 of the frame at a first end of the cover member 620 and overlap the rear cover 670 at a second end of the cover member 620 opposite to the first end thereof (e.g., along the X direction, for example).

A housing assembly according to various embodiments disclosed in this document may include a frame (e.g., frame 610 of FIG. 6A), a seating part (e.g., seating part 611 of FIG. 6C) concavely formed in a first direction at a location spaced apart from an outer surface of the frame, a first adhesive member (e.g., first adhesive member 410 of FIG. 6C) bonded onto the seating part and including a cushion layer (e.g., cushion layer 414 of FIG. 4B), a support member (e.g., support member 630 of FIG. 6C) accommodated on the seating part in the first direction and bonded to the first adhesive member, a second adhesive member (e.g., second adhesive member 420 of FIG. 6C) bonded to the support member, and a cover member (e.g., cover member 620 of FIG. 6C) configured to form the appearance of the electronic device and disposed on the second adhesive member in a second direction opposite to the first direction, so that a location with respect to the support member is fixed by the second adhesive member.

Further, the seating part may be formed with a thickness which is thicker than a thickness of the first adhesive member so that the first adhesive member is hidden by the outer surface of the frame. Here, the lower housing (e.g., the frame 610) may further include a sidewall 610A and the seating surface which extends from the sidewall to define the step 611, the first adhesive member 410 being bonded to the lower housing at the seating surface. At the step 611, the sidewall 610A may extend further from the seating surface than first adhesive member 410. The support member 630 and the first adhesive member 410 may be coplanar with the sidewall 610A of the lower housing (e.g., the frame 610).

Further, a distance between the support member and the cover member coupled by the second adhesive member may be smaller than a distance between the seating part and the support member coupled by the first adhesive member.

Further, the electronic device may further include an internal member (e.g., internal member 650 of FIG. 6C) disposed on an inside of the frame.

Further, the first adhesive member may be bonded to the seating part and the internal member.

Further, the electronic device may further include a camera module (e.g., camera module 700 of FIG. 6C), and the camera module may be accommodated in a camera seating part (e.g., camera seating part 613 of FIG. 6C) formed by the frame and the internal member.

Further, the electronic device may further include a window member (e.g., window member 680 of FIG. 6C) at least partly formed of a transparent material, and attached to the support member in the second direction so as to face a lens part (e.g., lens part 710 of FIG. 6C) of the camera module.

Further, the window member may be bonded to the support member by a third adhesive member (e.g., third adhesive member 430 of FIG. 6C). Here, the upper housing (e.g., the cover window 620) includes a transparent window 680 which faces a lens 710 of a camera 700 disposed within the housing assembly, and the transparent window 680 may be bonded to the support member 630 by a third adhesive member 430.

Further, the third adhesive member may include a cushion layer.

Further, the cover member may be disposed so that at least a part of the cover member covers a rear cover (e.g., rear cover 670 of FIG. 6C) disposed on a rear surface of the electronic device.

In an embodiment, a housing assembly includes a housing which forms an outer appearance of the housing assembly, the housing including a lower housing (e.g., the frame 610) including a step 611 at an end portion of the lower housing and an upper housing (e.g., the cover member 620 which faces the lower housing, a support member 630 which is between the lower housing and the upper housing and is bonded to the lower housing and to the upper housing, and adhesive members which bond the support member to the housing at an end portion of the housing. The adhesive members include a first adhesive member 410 which comprises a cushion layer 414 and a second adhesive member 420 which does not comprise the cushion layer 414. At the end portion of the housing a first distance S2 between the support member 630 and one housing among the lower housing and the upper housing is greater than a second distance S3 between the support member and the other housing among the lower housing and the upper housing. The first adhesive member 410 which includes the cushion layer 414 corresponds to the first distance S2 and bonds the support member to the lower housing at the step thereof.

The electronic devices according to various embodiments disclosed in this document may be various types of devices. The electronic device may include, for example, a portable communication device (e.g., smart phone), a computer device, a portable multimedia device, a portable medical device, a camera, a wearable device, or a home appliance. The electronic devices according to embodiments of this document are not limited to the above-described devices.

It should be appreciated that various embodiments of the disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar elements.

A singular form of a noun corresponding to an item may include one or a plurality of items, unless the relevant context clearly indicates otherwise. As used in the disclosure, each of such phrases as "A or B," "at least one of A and B," "at least one of A or B," "A, B, or C," "at least one of A, B, and C," or "at least one of A, B, or C" may include all possible combinations of the items enumerated together.

Such terms as "$1^{st}$," "2nd," "first," or "second" may be used to simply distinguish a corresponding component from another, and does not limit the components in other aspect (e.g., importance or order).

If it is described that if an element (e.g., a first element) is referred to, with or without the term "operatively" or "communicatively", as "connected to," or "coupled to" another element (e.g., a second element), it means that the element may be connected to the other element directly (e.g., by wire), wirelessly, or via a third element.

As used in the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure may be implemented as software (e.g., program 140) including one or more instructions stored in a machine-readable storage medium (e.g., internal memory 136 or external memory 138) that is readable by a machine (e.g., electronic device 101). For example, a processor (e.g., processor 120) of the machine (e.g., electronic device 101) may call at least one of one or more stored instructions from the storage media and may execute the called instructions. This enables the machine to perform at least one function in accordance with the at least one called instructions. The one or more instructions may include a code generated or executed by a complier or an interpreter. The machine-readable storage medium may be provided in the form of a non-transitory storage medium. Here, the term "non-transitory" simply means that the storage medium is a tangible device, and does not include a signal (e.g., electromagnetic waves), but this term does not differentiate between data semi-permanently stored in the storage medium and temporarily stored in the storage medium.

According to an embodiment, a method according to various embodiments disclosed in the disclosure may be included and provided in a computer program product. The computer program product may be traded as a product between a seller and a buyer. The computer program product may be distributed in the form of a machine-readable storage medium (e.g., compact disc read only memory (CD-ROM)), or be directly distributed online (e.g., download or upload) via an application store (e.g., PlayStore™) or between two user devices (e.g., smartphones). In case of online distribution, at least a part of the computer program product may be temporarily generated or at least temporarily stored in the machine-readable storage medium, such as memory of a manufacturer's server, a server of an application store, or a relay server.

According to various embodiments, each component (e.g., module or program) of the above-described components may include a single entity or multiple entities, and some of the plurality of entities may be disposed separately from other components. According to various embodiments, one or more of the above-described corresponding components or operations may be omitted, or one or more other components or operations may be added. Alternatively or additionally, a plurality of components (e.g., modules or programs) may be integrated into a single component, and the integrated single component may still perform functions of the plurality of components in the same or similar manner as they are performed before being integrated. According to various embodiments, operations performed by the module, the program, or another component may be carried out sequentially, in parallel, repeatedly, or heuristically, or one or more of the operations may be executed in a different order or omitted, or other operations may be added.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present. Elements being in contact or being "directly" related to each other, may form an interface therebetween.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

What is claimed is:

1. An electronic device comprising:

a housing which forms an outer appearance of the electronic device, the housing comprising:

a frame including a step which is at an end portion of the frame, the step defined by a sidewall and a seating surface which extends from the sidewall, and a cover member which is at a rear of the electronic device and faces the step of the frame;

a support member which is between the step of the frame and the cover member, a first end of the support member being inside the sidewall; and adhesive members which bond the support member to the housing, the adhesive members comprising:

a first adhesive member which comprises a cushion layer and bonds the support member to the frame, at the seating surface of the step; and a second adhesive member which bonds the support member and the cover member to each other.

2. The electronic device of claim 1, wherein;

the first adhesive member is bonded to the frame at the seating surface, and at the step, the sidewall extends further from the seating surface than the first adhesive member.

3. The electronic device of claim 1, wherein a distance between the support member and the cover member which are coupled to each other by the second adhesive member is smaller than a distance between the seating surface and the support member which are coupled to each other by the first adhesive member.

4. The electronic device of claim 1, further comprising an internal member adjacent to the seating surface of the frame at an inside of the frame.

5. The electronic device of claim 4, wherein the first adhesive member is bonded to the frame at the seating surface and to the internal member which is adjacent to the seating surface.

6. The electronic device of claim 4, further comprising:

the frame extending from the internal member, in a direction away from the first adhesive member, to define a camera seating area, and a camera accommodated in the camera seating area.

7. The electronic device of claim 6, further comprising:

the camera including a lens, and the housing further comprising a transparent window member which faces the lens of the camera.

8. The electronic device of claim 7, wherein the adhesive members further comprise a third adhesive member which bonds the transparent window member to the support member.

9. The electronic device of claim 8, wherein the adhesive members further comprise cushion adhesive members respectively including the cushion layer, and the cushion adhesive members include the first adhesive member and the third adhesive member among the first adhesive member, the second adhesive member and the third adhesive member.

10. The electronic device of claim 9, wherein the cushion adhesive members do not include the second adhesive member among the first adhesive member, the second adhesive member and the third adhesive member.

11. The electronic device of claim 1, wherein the housing further comprises a rear cover adjacent to the cover member at the rear of the electronic device, and the cover member faces the step of the frame at the first end of the cover member and overlaps the rear cover at a second end of the cover member opposite to the first end thereof.

12. A housing assembly comprising:

a housing which forms an outer appearance of the housing assembly, the housing comprising:

a lower housing including a step at an end portion of the lower housing, the step defined by a sidewall and a seating surface which extends from the sidewall; and an upper housing which faces the step of the lower housing;

a support member which is between the step of the lower housing and the upper housing, a first end of the support member being inside the sidewall; and adhesive members which bond the support member to the housing, the adhesive members comprising:

a first adhesive member which comprises a cushion layer and bonds the support member to the lower housing, at the seating surface of the step; and a second adhesive member which bonds the support member and the upper housing to each other.

13. The housing assembly of claim 12, wherein the first adhesive member is bonded to the lower housing at the seating surface, and at the step, the sidewall extends further from the seating surface than the first adhesive member.

14. The housing assembly of claim 12, wherein a distance between the support member and the upper housing which are coupled to each other by the second adhesive member is smaller than a distance between the seating surface and the support member which are coupled to each other by the first adhesive member.

15. The housing assembly of claim 12, further comprising an internal member adjacent to the seating surface of the lower housing, wherein the first adhesive member is bonded to the lower housing at the seating surface and to the internal member which is adjacent to the seating surface.

16. The housing assembly of claim 12, wherein the housing further comprises a rear cover adjacent to the upper housing at a rear of the housing assembly, and the upper housing faces the step of the lower housing at a first end of the upper housing and overlaps the rear cover at a second end of the upper housing with is opposite to the first end thereof.

17. The housing assembly of claim 12, wherein the first adhesive member is bonded to the lower housing at the seating surface, and the support member and the first adhesive member are coplanar with the sidewall of the lower housing.

18. The housing assembly of claim 12, wherein the upper housing includes a transparent window which faces a lens of a camera disposed within the housing assembly, and the transparent window is bonded to the support member by a third adhesive member.

19. The housing assembly of claim 18, wherein the adhesive members further comprise cushion adhesive members respectively including the cushion layer, and among the first adhesive member, the second adhesive member and the third adhesive member, the cushion adhesive members include the first adhesive member and the third adhesive member and do not include the second adhesive member.

20. An electronic device comprising:

a display disposed on a front side of the electronic device;

a housing which forms an outer appearance of the electronic device and supports the display, the housing comprising:

a lower housing including a step at an end portion of the lower housing; and an upper housing which faces the lower housing and is disposed on a rear side of the electronic device;

a support member disposed between the lower housing and the upper housing and bonded to the lower housing and to the upper housing; and adhesive members which bond the support member to the housing, the adhesive members comprising:

a first adhesive member which comprises a cushion layer and bonds the support member to the lower housing at a seating surface of the step; and a second adhesive member which bonds the support member and the upper housing to each other, wherein a distance between the support member and the upper housing which are coupled to each other by the second adhesive member is smaller than a distance between the seating surface of the lower housing and the support member which are coupled to each other by the first adhesive member.

* * * * *